(12) United States Patent
Shen et al.

(10) Patent No.: US 8,232,147 B2
(45) Date of Patent: Jul. 31, 2012

(54) FABRICATING METHOD OF A THIN FILM TRANSISTOR HAVING A DIELECTRIC LAYER FOR INHIBITING LEAKAGE CURRENT

(75) Inventors: Guang-Ren Shen, Yunlin County (TW); Pei-Ming Chen, Taipei County (TW); Chun-Hsiun Chen, Hsinchu (TW); Wei-Ming Huang, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/779,955

(22) Filed: May 14, 2010

(65) Prior Publication Data
US 2011/0215324 A1 Sep. 8, 2011

(30) Foreign Application Priority Data

Mar. 3, 2010 (TW) .............................. 99106133 A

(51) Int. Cl.
*H01L 29/786* (2006.01)
(52) U.S. Cl. .................. 438/151; 257/66; 257/E29.289; 257/E29.292; 257/E21.412; 257/57; 438/158
(58) Field of Classification Search .................. 257/57, 257/66, E29.289, E29.292, E21.412; 438/158, 438/151
See application file for complete search history.

(56) References Cited

U.S. PATENT DOCUMENTS

| 5,757,028 | A  | * | 5/1998  | Sasaki et al. .................... 257/57 |
| 6,531,330 | B2 |   | 3/2003  | Lay et al. |
| 6,674,093 | B1 |   | 1/2004  | Tanaka et al. |
| 6,788,355 | B1 |   | 9/2004  | Ihida et al. |
| 7,635,616 | B2 |   | 12/2009 | Deng et al. |
| 2004/0063254 | A1 | * | 4/2004 | Wang et al. .................... 438/149 |
| 2007/0026555 | A1 | * | 2/2007 | Lee .................................... 438/30 |
| 2007/0272926 | A1 |   | 11/2007 | Deng et al. |
| 2008/0014665 | A1 | * | 1/2008 | Kim .................................. 438/30 |
| 2010/0157187 | A1 |   | 6/2010 | Deng et al. |

FOREIGN PATENT DOCUMENTS

| CN | 101078842 A | 11/2007 |
| JP | S64-050567  | 2/1989  |

OTHER PUBLICATIONS

"First Office Action of China Counterpart Application", issued on May 25, 2011, p. 1-p. 7, in which the listed references were cited.
"Second Office Action of China Counterpart Application", issued on Apr. 14, 2012, p. 1-p. 7, in which the listed references were cited.

* cited by examiner

*Primary Examiner* — Marc Armand
(74) *Attorney, Agent, or Firm* — Jianq Chyun IP Office

(57) ABSTRACT

A thin film transistor (TFT) and a fabricating method thereof are provided. The TFT includes a channel layer, an ohmic contact layer, a dielectric layer, a source, a drain, a gate, and a gate insulating layer. The channel layer has an upper surface and a sidewall. The ohmic contact layer is disposed on a portion of the upper surface of the channel layer. The dielectric layer is disposed on the sidewall of the channel layer, and does not overlap with the ohmic contact layer. The source and the drain are disposed on portions of the ohmic contact layer and the dielectric layer. A portion of dielectric layer is not covered by the source or the drain. The gate is above or below the channel layer. The gate insulating layer is disposed between the gate and the channel layer.

12 Claims, 6 Drawing Sheets

US 8,232,147 B2

FABRICATING METHOD OF A THIN FILM TRANSISTOR HAVING A DIELECTRIC LAYER FOR INHIBITING LEAKAGE CURRENT

CROSS-REFERENCE TO RELATED APPLICATION

This application claims the priority benefit of Taiwan application serial no. 99106133, filed on Mar. 3, 2010. The entirety of the above-mentioned patent application is hereby incorporated by reference herein and made a part of specification.

BACKGROUND OF THE INVENTION

1. Field of the Invention

The invention is related to a semiconductor device and a fabricating method thereof, and in particular to a thin film transistor and a fabricating method thereof.

2. Description of Related Art

In recent years, as optoelectronic technology and semiconductor fabrication technology increasingly mature, development of flat panel displays has boomed. Since liquid crystal displays have advantages such as low operating voltage, no radioactive emissions, light weight, and small volume, liquid crystal displays have gradually replaced conventional cathode ray tube displays to become the mainstream product. Generally, liquid crystal displays may be classified into amorphous silicon thin film transistor liquid crystal displays (a-Si TFT-LCDs) and low temperature poly-silicon thin film transistor liquid crystal displays (LTPS TFT-LCDs).

FIG. 1A is a schematic cross-sectional view of a conventional thin film transistor. Please refer to FIG. 1A., a thin film transistor 100 is disposed on a substrate 101 and includes a gate 110, a patterned amorphous silicon layer 120 (which is a channel layer), a source 130, and a drain 132, wherein each of the source 130 and the drain 132 is connected to the channel layer 120 through an ohmic contact layer 140. When a high voltage is applied to the gate 100, the thin film transistor 100 is turned on, so that the channel layer 120 is in a conductive state, thereby connecting the source 130 and the drain 132. However, when a high voltage is not applied to the gate 110, the thin film transistor 100 is turned off, a leakage current is often generated by the channel layer 120 as the channel layer is irradiated by external light, thereby affecting reliability of the thin film transistor 100. In order to reduce leakage currents, conventional art provides an improvement method by performing a plasma treatment during the process of fabricating the thin film transistor 100. FIG. 1B is a schematic view of a conventional plasma treatment. Please refer to FIG. 1B, the plasma treatment is performed after the ohmic contact layer 140 and a photoresist layer 150 are formed and before a second metallic layer that is used to form the source 130 and the drain 132 is deposited. A plasma 160 used in the plasma treatment process may be an oxygen plasma ($O_2$-plasma) or an argon plasma (Ar-plasma). After the plasma treatment is performed, a layer of silicon oxide (SiOx) thin film is formed on sidewalls 121 and 123 of the channel layer 120, so as to reduce the leakage current.

FIG. 1C is a schematic cross-sectional view of a conventional thin film transistor. Please refer to both FIGS. 1A and 1C, the difference between FIGS. 1A and 1C lies in that a source 170, a drain 172, and an ohmic contact layer 180 of the thin film transistor 102 are fabricated by using the same photolithography and etch process (PEP), so that the source 170 and the drain 172 have substantial the same pattern as the ohmic contact layer 180. However, in the thin film transistor shown in FIG. 1C, the drawbacks resulted from leakage currents still cannot be effectively solved.

SUMMARY OF THE INVENTION

The invention provides a thin film transistor and a fabricating method thereof which are capable of reducing leakage currents.

The invention provides a fabricating method of a thin film transistor which includes the following steps. A gate is formed on a substrate. A gate insulating layer is formed on the substrate, so as to cover the gate. A channel material layer, an ohmic contact material layer, and a patterned photoresist layer are sequentially formed on the gate insulating layer, wherein the patterned photoresist layer is located above the gate. The channel material layer and the ohmic contact material layer are patterned by using the patterned photoresist layer as a mask, so as to form a channel layer and an ohmic contact layer which is between the channel layer and the patterned photoresist layer. A dielectric layer is formed on the patterned photoresist layer, on a sidewall of the channel layer, on a sidewall of the ohmic contact layer, and on a portion of the gate insulating layer. The patterned photoresist layer and a portion of the dielectric layer that is in contact with the patterned photoresist layer are removed, so as to expose the ohmic contact layer. A source and a drain are formed on a portion of the dielectric layer and on a portion of the ohmic contact layer, and a portion of the ohmic contact layer that is not covered by the source or the drain is removed.

According to an embodiment of the invention, the fabricating method of the thin film transistor further includes a step of forming a passivation layer so as to cover the source, the drain, a portion of the dielectric layer, and a portion of the channel layer.

The invention also provides a fabricating method of a thin film transistor which includes the following steps. A channel material layer, an ohmic contact material layer, and a patterned photoresist layer are sequentially formed on a substrate; The channel material layer and the ohmic contact material layer are patterned by using the patterned photoresist layer as a mask, so as to form a channel layer and an ohmic contact layer which is between the channel layer and the patterned photoresist layer. A dielectric layer is formed on the patterned photoresist layer, on a sidewall of the channel layer, and on a sidewall of the ohmic contact layer. The patterned photoresist layer and a portion of the dielectric layer that is in contact with the patterned photoresist layer are removed, so as to expose the ohmic contact layer. A source and a drain are formed on a portion of the dielectric layer and on a portion of the ohmic contact layer, and a portion of the ohmic contact layer that is not covered by the source or the drain is removed. A gate insulating layer is formed on the substrate, so as to cover the source, the drain, a portion of the dielectric layer, and a portion of the channel layer. A gate is formed on the gate insulating layer, wherein the gate is above the channel layer.

According to an embodiment of the invention, the method of removing the patterned photoresist layer and the portion of the dielectric layer that is in contact with the patterned photoresist layer includes a lift-off process.

According to an embodiment of the invention, after the patterned photoresist layer is removed, the dielectric layer is connected to the sidewall of the ohmic contact layer, and the dielectric layer and the ohmic contact layer are not overlapped.

According to an embodiment of the invention, the fabricating method of the thin film transistor further includes a step of forming a passivation layer so as to cover the gate and the gate insulating layer.

According to an embodiment of the invention, the above dielectric layer further covers a portion of the substrate.

According to an embodiment of the invention, the fabricating method of the thin film transistor further includes a step of forming a buffer layer on the substrate before the channel material layer is formed, wherein the above dielectric layer further covers a portion of the buffer layer.

The invention also provides a thin film transistor which is suitable for being disposed on a substrate. The thin film transistor includes a channel layer, an ohmic contact layer, a dielectric layer, a source, a drain, a gate, and a gate insulating layer. The channel layer has an upper surface and a sidewall. The ohmic contact layer is disposed on a portion of the upper surface of the channel layer. The dielectric layer is disposed on the sidewall of the channel layer, wherein the dielectric layer and ohmic contact layer are not overlapped. The source and the drain are disposed on portions of the ohmic contact layer and the dielectric layer, and a portion of the dielectric layer is not covered by the source or the drain. The gate is above or below the channel layer. The gate insulating layer is disposed between the gate and the channel layer.

According to an embodiment of the invention, when the gate is below the channel layer, the gate insulating layer is disposed on the substrate to cover the gate, and the dielectric layer extends from the sidewall of the channel layer to the substrate.

According to an embodiment of the invention, the thin film transistor further includes a passivation layer so as to cover the source, the drain, a portion of the dielectric layer, and a portion of the channel layer.

According to an embodiment of the invention, when the gate is above the channel layer, the gate insulating layer covers the source, the drain, a portion of the dielectric layer, and a portion of the channel layer.

According to an embodiment of the invention, the thin film transistor further includes a passivation layer so as to cover the gate and the gate insulating layer.

According to an embodiment of the invention, the thin film transistor further includes a buffer layer which is between the dielectric layer and the substrate and between the channel layer and the substrate.

In summary, the thin film transistors and the fabricating methods thereof of the invention are effective in inhibiting leakage currents, thereby enhancing reliability.

In order to make the aforementioned and other objects, features and advantages of the invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

First Embodiment

FIGS. 2A to 2H are schematic cross-sectional views showing a process of fabricating a thin film transistor according to the first embodiment of the invention. Please refer to FIG. 2A. The fabricating method of a thin film transistor 220 according to the present embodiment includes the following steps. First, a gate 222 is formed on the substrate 210. The gate 222 may be formed through a first photolithography and etch process (1st PEP). The material of the substrate 210 may be an inorganic transparent material (such as glass, quartz, other suitable materials, or combinations thereof), an organic transparent material (such as a polyolefin, a polysuccinate, a polyol, a polyester, rubber, a thermoplastic polymer, a thermosetting polymer, a polyaromatic hydrocarbon, a polymethylmethacrylate, a poly carbonate, other suitable materials, derivatives of the above, or combinations thereof), an inorganic non-transparent material (such as silicon sheets, ceramic, derivatives of the above, or combinations thereof), or combinations thereof.

Figure 1A:
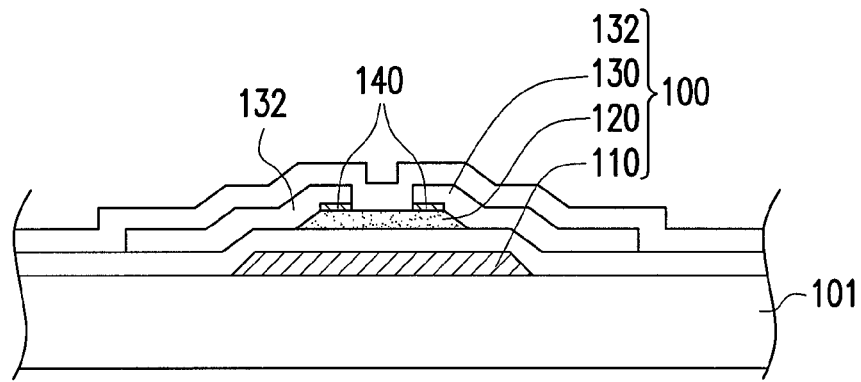
FIG. 1A is a schematic cross-sectional view of a conventional thin film transistor.
Figure 1B:
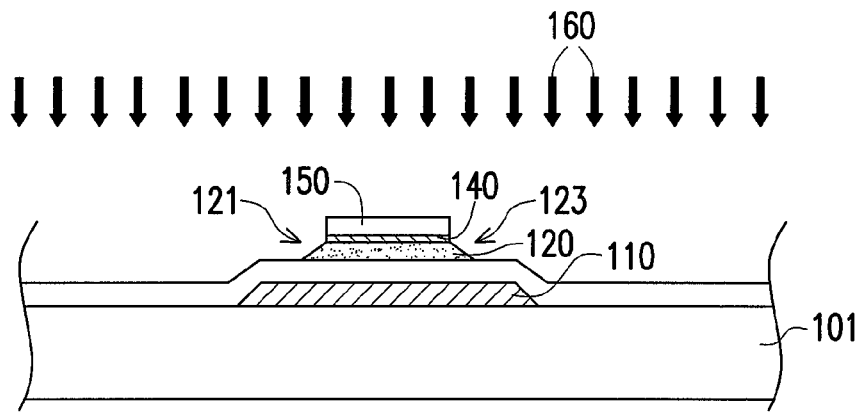
FIG. 1B is a schematic view of a conventional plasma treatment.
Figure 1C:
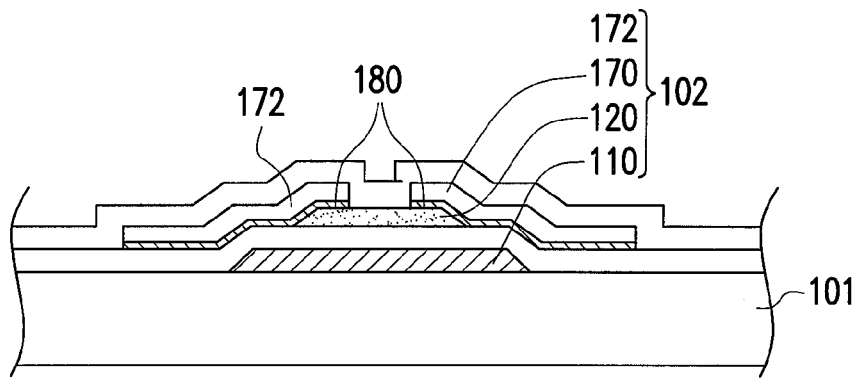
FIG. 1C is a schematic cross-sectional view of a conventional thin film transistor.
Figure 2A:
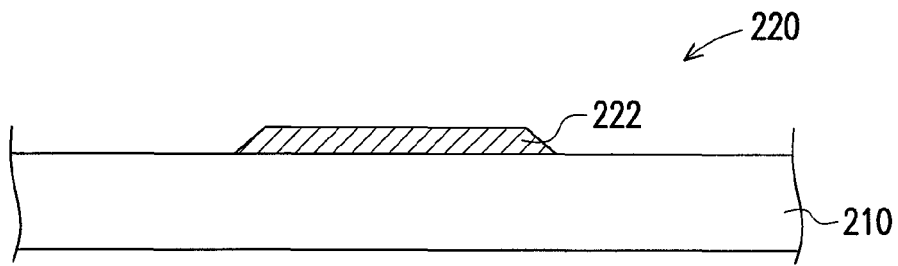
FIGS. 2A to 2H are schematic cross-sectional views showing a process of fabricating a thin film transistor according to the first embodiment of the invention.
Figure 2B:
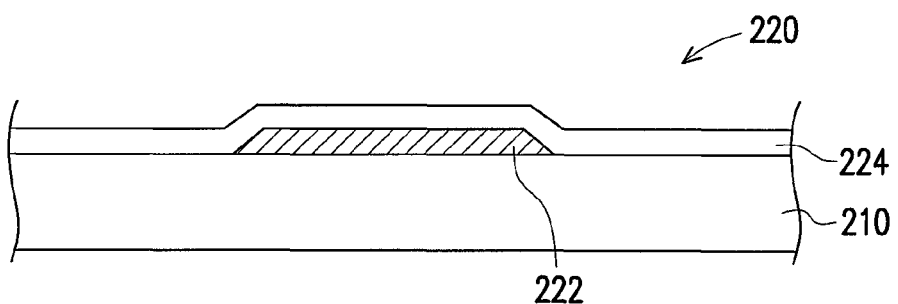
Figure 2C:
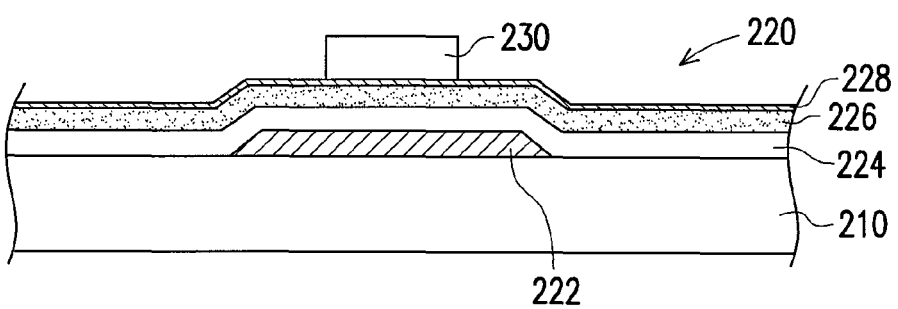

Please refer to FIG. 2B. A gate insulating layer 224 is formed on the substrate 210, so as to cover the gate 222 and the substrate 210. For example, the material of the gate insulating layer 224 is an inorganic material such as silicon oxide ($SiO_x$) or silicon nitride ($SiN_x$). Please refer to FIG. 2C. Next, a channel material layer 226, an ohmic contact material layer 228, and a patterned photoresist layer 230 are sequentially formed on the gate insulating layer 224, wherein the patterned photoresist layer 230 is above the gate 222, and the material of the patterned photoresist layer 230 may be a photoresist (PR), a metal, or a removable material. The material of the ohmic contact material layer 228 may be an N-type doped semiconductor material, such as N-type doped amorphous silicon ($n^+$ a-Si), and the material of the channel material layer 226 may be amorphous silicon (a-Si).

Figure 2D:
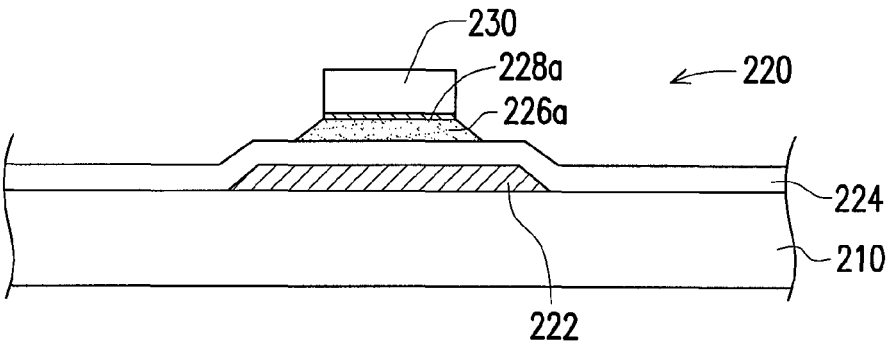

Please refer to FIG. 2D. Next, by using the patterned photoresist layer 230 as a mask, a portion of the ohmic contact material layer 228 which is not covered by the patterned photoresist layer 230 and a portion of the channel material 226 are removed, thereby forming a patterned channel layer 226a and an ohmic contact layer 228a between the channel layer 226a and the photoresist layer 230.

Figure 2E:
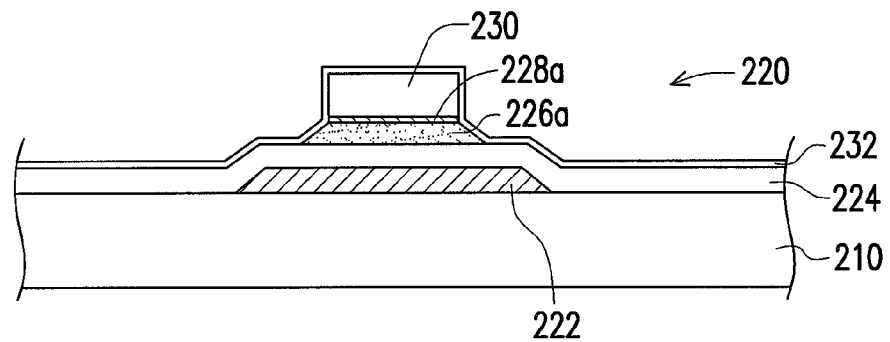

Please refer to FIG. 2E. A dielectric layer 232 is formed on the patterned photoresist layer 230, on a sidewall of the channel layer 226a, on a sidewall of the ohmic contact layer 228a and on the gate insulating layer 224. The method for depositing the dielectric layer 232 may be physical vapor deposition (PVD), chemical vapor deposition (CVD), or solution spin-coating. The material of the dielectric layer 232 may be silicon oxide ($SiO_x$), silicon nitride ($SiN_x$), or silicon oxynitride (SiON), the physical vapor deposition is, for example, sputtering, and the chemical vapor deposition is, for example, plasma enhanced chemical vapor deposition (PECVD).

Figure 2F:
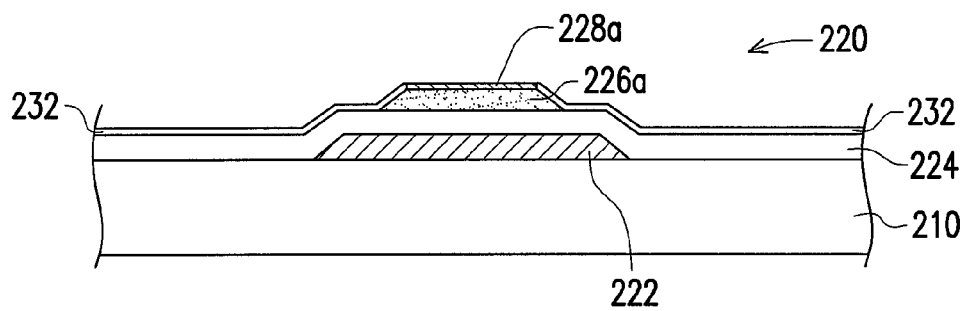

Please refer to FIG. 2F. Next, the patterned photoresist layer 230 and a portion of the dielectric layer 232 that is in contact with the patterned photoresist layer 230 are removed, so that the ohmic contact layer 228a is exposed. The method of removing the patterned photoresist layer 230 and the portion of the dielectric layer 232 that is in contact with the patterned photoresist layer 230 may be a lift-off process. After the patterned photoresist layer 230 is removed, the dielectric layer 232 is connected to the sidewall of the ohmic contact layer 228a, and the dielectric layer 232 and the ohmic contact layer 228a are not overlapped.

Figure 2G:
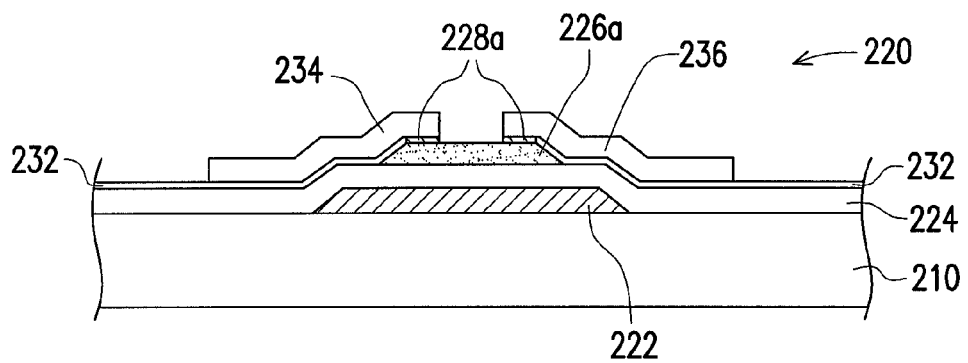

Please refer to FIG. 2G. Afterwards, a source 234 and a drain 236 are formed on a portion of the dielectric layer 232 and on a portion of the ohmic contact layer 228a, and a portion of the ohmic contact layer 228a that is not covered by the source 234 or the drain 236 is removed. As shown in FIG. 2G, the source 234 and the drain 236 are formed by a third photolithography and etch process (3rd PEP), and the 3rd PEP process is a half-tone mask (HTM) process, a grayscale mask (GM) process, or a slit mask (SM) process, so that in the present embodiment, the number of photolithography and etch processes that are used is further reduced, thereby reducing the fabrication cost and time. Please refer to FIG. 2H. Last, a passivation layer 238 which covers the source 234, the drain 236, a portion of the dielectric layer 232 and a portion of the channel layer 226a is formed, so as to protect the thin film transistor 220.

Figure 2H:
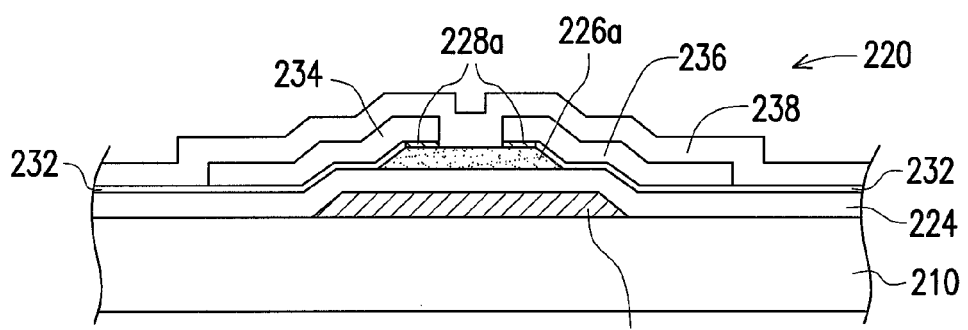

As shown in FIG. 2H, the thin film transistor 220 is a bottom-gate thin film transistor and has the gate 222, the gate insulating layer 224, the channel layer 226a, the ohmic contact layer 228a, the dielectric layer 232, the source 234, the drain 236, and the passivation layer 238. The gate 222 is below the channel layer 226a. The gate insulating layer 224 is disposed between the gate 222 and the channel layer 226a. The ohmic contact layer 228a is disposed on a portion of the upper surface of the channel layer 226a. The dielectric layer 232 is disposed on the sidewall of the channel layer 226a, and the dielectric layer 232 and ohmic contact layer 228a are in contact but are not overlapped. The source 234 and the drain 236 are disposed on portions of the ohmic contact layer 228a and the dielectric layer 232, and a portion of the dielectric layer 232 is not covered by the source 234 and the drain 236. The passivation layer 238 covers the source 234, the drain 236, a portion of the dielectric layer 232, and a portion of the channel layer 226a.

Second Embodiment

FIGS. 3A to 3I are schematic cross-sectional views showing a process of fabricating a thin film transistor according to the second embodiment of the invention. Please refer to FIG. 3A. The fabrication method of a thin film transistor 320 according to the present embodiment includes the following steps. First, a buffer layer 322 is formed on a substrate 310, wherein the material of the buffer layer 322 may be a dielectric material such as silicon oxide or silicon nitride.

Figure 3A:
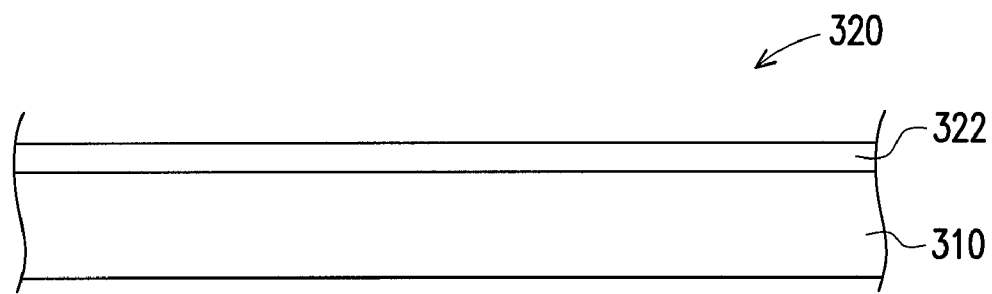
FIGS. 3A to 3I are schematic cross-sectional views showing a process of fabricating a thin film transistor according to the second embodiment of the invention.
Figure 3B:
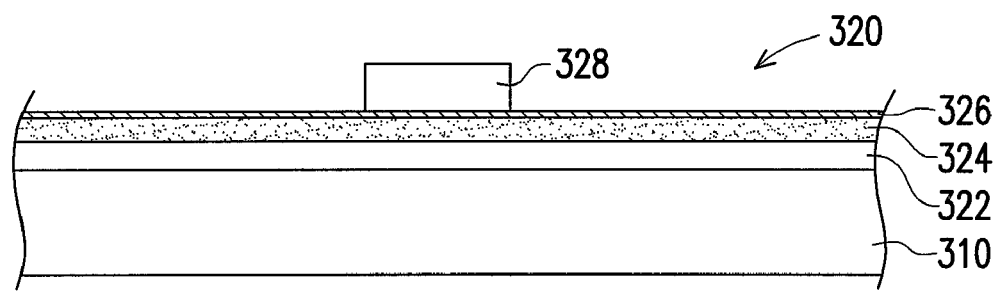
Figure 3C:
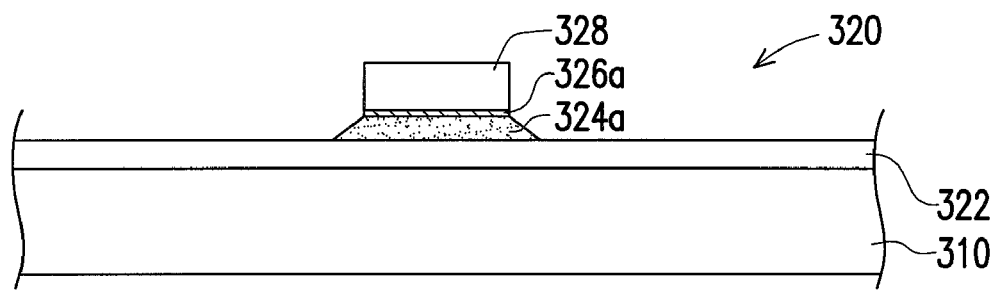
Figure 3D:
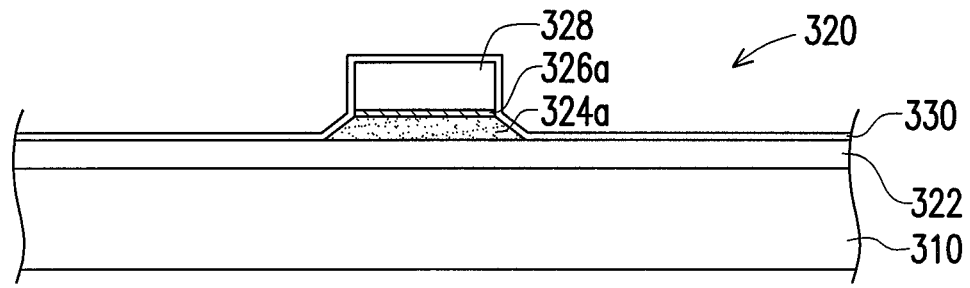

Please refer to FIGS. 3B to 3D. Next, a channel material layer 324, an ohmic contact material layer 326, and a patterned photoresist layer 328 are sequentially formed on the buffer layer 322, wherein the material of the channel material layer 324 may be amorphous silicon or polysilicon (poly-Si). Similarly, by using the patterned photoresist layer 328 as a mask, the channel material layer 324 and the ohmic contact material layer 326 are patterned, so that a channel layer 324a and an ohmic contact layer 326a between the channel layer 324a and the patterned photoresist layer 328 are formed. Then, a dielectric layer 330 is formed on the patterned photoresist layer 328, a sidewall of the channel layer 324a, a sidewall of the ohmic contact layer 326a, and a portion of the buffer layer 322.

Figure 3E:
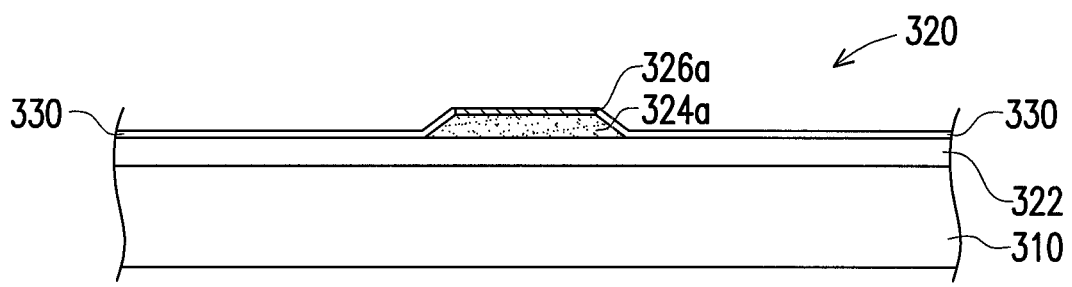
Figure 3F:
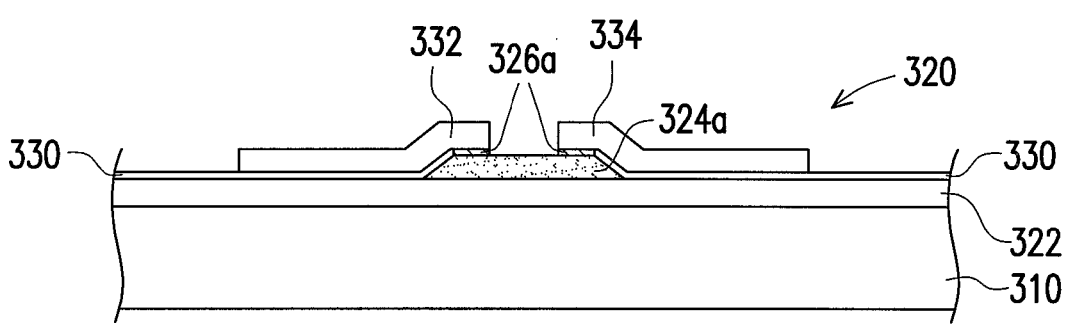

Please refer to FIGS. 3E and 3F. Next, the patterned photoresist layer 328 and a portion of the dielectric layer 330 which is in contact with the patterned photoresist layer 328 are removed, so that the ohmic contact layer 326a is exposed. After the patterned photoresist layer 328 is removed, the dielectric layer 330 is connected to the sidewall of the ohmic contact layer 326a, and the dielectric layer 330 and the ohmic contact layer 326a are not overlapped. Afterwards, a source 332 and a gate 334 are formed on a portion of the dielectric layer 330 and on a portion of the ohmic contact layer 326a, and a portion of the ohmic contact layer 326a that is not covered by the source 332 or the drain 334 is removed.

Figure 3G:
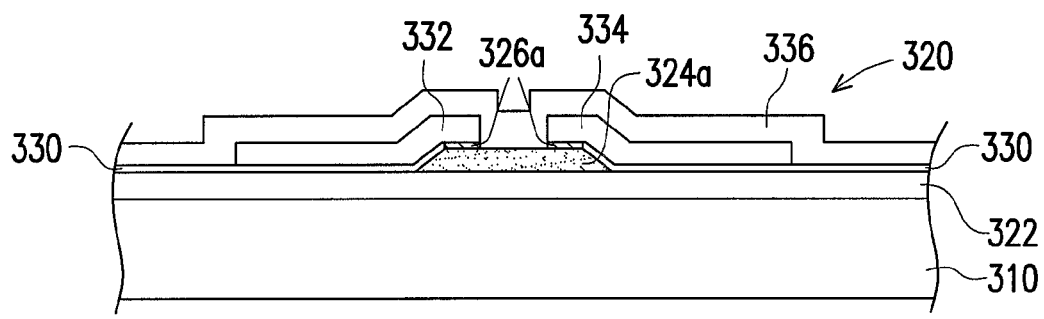
Figure 3H:
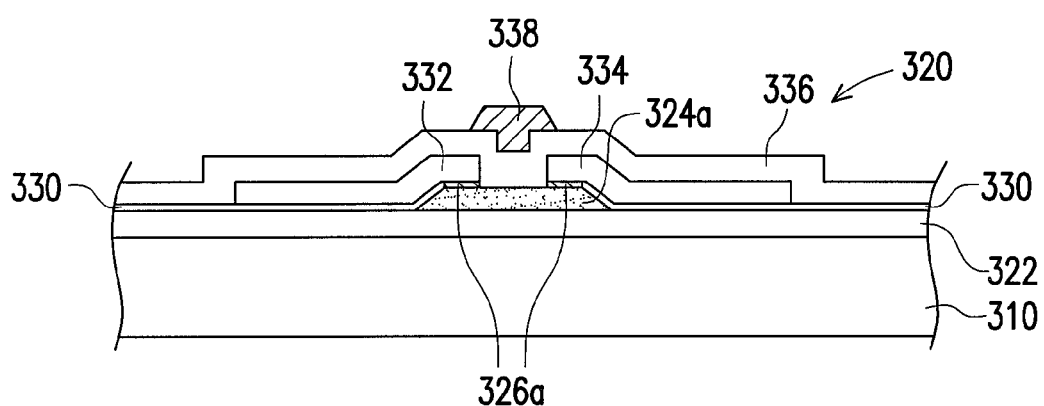
Figure 3I:
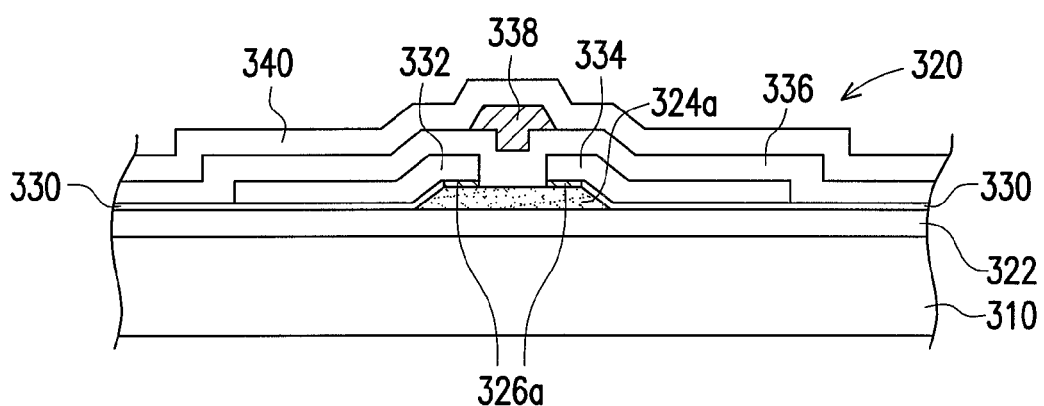

Please refer to FIGS. 3G to 3I. Next, a gate insulating layer 336 is formed on the substrate 310, so as to cover the source 332, the drain 334, a portion of the dielectric layer 330, and a portion of the channel layer 326a. Then, a gate 338 is formed on the gate insulating layer 336, wherein the gate 338 is above the channel layer 324a. Last, a passivation layer 340 is formed to cover the gate 338 and the gate insulating layer 336.

As shown in FIG. 3I, the thin film transistor 320 is a top-gate thin film transistor and has the buffer layer 322, the channel layer 324a, the ohmic contact layer 326a, the dielectric layer 330, the source 332, the drain 334, the gate 338, and the passivation layer 340. The buffer layer 322 is between the dielectric layer 330 and the substrate 310 and between the channel layer 324a and the substrate 310. The ohmic contact layer 326a is disposed on a portion of the upper surface of the channel layer 324a. The dielectric layer 330 is disposed on the sidewall of the channel layer 324a, and the dielectric layer 330 and ohmic contact layer 326a are in contact but are not overlapped. The source 332 and the drain 334 are disposed on portions of the ohmic contact layer 326a and the dielectric layer 330, and a portion of the dielectric layer 330 is not covered by the source 332 and the drain 334. The gate 338 is above the channel layer 324a. The gate insulating layer 336 is disposed between the gate 338 and the channel layer 324a, and covers the source 332, the drain 334, a portion of the dielectric layer 330, and a portion of the channel layer 324a. The passivation layer 340 covers the gate 338 and the gate insulating layer 336.

It should be noted that when the material of the channel layer 324a is amorphous silicon, the buffer layer 332 may be omitted in the structure of the thin film transistor 320, meaning that the step of forming the buffer layer 332 may be omitted to directly form the channel layer 324a on the substrate 310, and that a portion of the dielectric layer 330 covers the substrate 310.

In summary, the thin film transistors and the fabricating methods thereof according to the embodiments of the invention are effective in inhibiting leakage currents. In addition, since patterning of the dielectric layer may be accomplished by a lift-off process, manufacturing cost and time are reduced.

It will be apparent to those skilled in the art that various modifications and variations can be made to the structure of the invention without departing from the scope or spirit of the invention. In view of the foregoing, it is intended that the present invention cover modifications and variations of this invention provided they fall within the scope of the following claims and their equivalents.

What is claimed is:

1. A fabricating method of a thin film transistor, comprising:
   forming a gate on a substrate;
   forming a gate insulating layer on the substrate to cover the gate;
   sequentially forming a channel material layer, an ohmic contact material layer, and a patterned photoresist layer on the gate insulating layer, wherein the patterned photoresist layer is located above the gate;

patterning the channel material layer and the ohmic contact material layer by using the patterned photoresist layer as a mask, so as to form a channel layer and an ohmic contact layer between the channel layer and the patterned photoresist layer;

forming a dielectric layer to completely cover the patterned photoresist layer, a sidewall of the channel layer, a sidewall of the ohmic contact layer, and the gate insulating layer, wherein the dielectric layer is a continuous layer;

removing the patterned photoresist layer and a portion of the dielectric layer that is in contact with the patterned photoresist layer, so as to expose the ohmic contact layer; and forming a source and a drain on a portion of the dielectric layer and on a portion of the ohmic contact layer, and removing a portion of the ohmic contact layer that is not covered by the source or the drain.

2. The fabricating method of the thin film transistor as claimed in claim 1, wherein a method of removing the patterned photoresist layer and the portion of the dielectric layer that is in contact with the patterned photoresist layer comprises a lift-off process.

3. The fabricating method of the thin film transistor as claimed in claim 1, wherein after removing the patterned photoresist layer, the dielectric layer is connected to the sidewall of the ohmic contact layer, and the dielectric layer and the ohmic contact layer are not overlapped.

4. The fabricating method of the thin film transistor as claimed in claim 1, further comprising forming a passivation layer to cover the source, the drain, the dielectric layer, and the channel layer.

5. A fabricating method of a thin film transistor, comprising:

sequentially forming a channel material layer, an ohmic contact material layer, and a patterned photoresist layer on a substrate;

patterning the channel material layer and the ohmic contact material layer by using the patterned photoresist layer as a mask, so as to form a channel layer and an ohmic contact layer between the channel layer and the patterned photoresist layer;

forming a dielectric layer completely covering the patterned photoresist layer, a sidewall of the channel layer, and a sidewall of the ohmic contact layer, wherein the dielectric layer is a continuous layer;

removing the patterned photoresist layer and a portion of the dielectric layer that is in contact with the patterned photoresist layer, so as to expose the ohmic contact layer;

forming a source and a drain on a portion of the dielectric layer and on a portion of the ohmic contact layer, and removing a portion of the ohmic contact layer that is not covered by the source or the drain;

forming a gate insulating layer on the substrate, so as to cover the source, the drain, the dielectric layer, and the channel layer; and forming a gate on the gate insulating layer, wherein the gate is located above the channel layer.

6. The fabricating method of the thin film transistor as claimed in claim 5, wherein a method of removing the patterned photoresist layer and the portion of the dielectric layer that is in contact with the patterned photoresist layer comprises a lift-off process.

7. The fabricating method of the thin film transistor as claimed in claim 5, wherein after removing the patterned photoresist layer, the dielectric layer is connected to the sidewall of the ohmic contact layer, and the dielectric layer and the ohmic contact layer are not overlapped.

8. The fabricating method of the thin film transistor as claimed in claim 5, further comprising forming a passivation layer to cover the gate and the gate insulating layer.

9. The fabricating method of the thin film transistor as claimed in claim 5, wherein the dielectric layer further covers a portion of the substrate.

10. The fabricating method of the thin film transistor as claimed in claim 5, further comprising forming a buffer layer on the substrate before forming the channel material layer.

11. The fabricating method of the thin film transistor as claimed in claim 10, wherein the dielectric layer further covers a portion of the buffer layer.

12. A fabricating method of a thin film transistor, comprising:

forming a gate on a substrate;

forming a gate insulating layer on the substrate to cover the gate, wherein the gate insulating layer is comprised of silicon oxide or silicon nitride;

sequentially forming a channel material layer, an ohmic contact material layer, and a patterned photoresist layer on the gate insulating layer, wherein the patterned photoresist layer is located above the gate;

patterning the channel material layer and the ohmic contact material layer by using the patterned photoresist layer as a mask, so as to form a channel layer and an ohmic contact layer between the channel layer and the patterned photoresist layer;

forming a dielectric layer on the patterned photoresist layer, on a sidewall of the channel layer, on a sidewall of the ohmic contact layer, and on the gate insulating layer after the step of forming the gate insulating layer, wherein the dielectric layer is comprised of silicon oxide, silicon nitride, or silicon oxynitride;

removing the patterned photoresist layer and a portion of the dielectric layer that is in contact with the patterned photoresist layer, so as to expose the ohmic contact layer; and forming a source and a drain on a portion of the dielectric layer and on a portion of the ohmic contact layer, and removing a portion of the ohmic contact layer that is not covered by the source or the drain.

* * * * *